United States Patent [19]

Siligoni et al.

[11] Patent Number: 4,979,008

[45] Date of Patent: Dec. 18, 1990

[54] VERTICAL ISOLATED-COLLECTOR TRANSISTOR OF THE PNP TYPE INCORPORATING A DEVICE FOR SUPPRESSING THE EFFECTS OF PARASITIC JUNCTION COMPONENTS

[75] Inventors: Marco Siligoni, Vittuone; Flavio Villa, Milan, both of Italy

[73] Assignee: SGS-Thomson Microelectronics S.r.l., Milan, Italy

[21] Appl. No.: 298,651

[22] Filed: Jan. 18, 1989

[30] Foreign Application Priority Data

Feb. 4, 1988 [IT] Italy .................. 19306 A/88

[51] Int. Cl.⁵ ............................................ H01L 29/72
[52] U.S. Cl. .................................... 357/34; 357/35; 357/42; 357/48; 357/86
[58] Field of Search ............... 357/34, 35, 42, 48, 357/86

[56] References Cited

U.S. PATENT DOCUMENTS 4,476,480 10/1984 Fuse ..................................... 357/48
4,684,970 8/1987 Sloane et al. ....................... 357/86
4,807,009 2/1989 Fushimi et al. ..................... 357/86

Primary Examiner—Edward J. Wojciechowicz
Attorney, Agent, or Firm—Rosen, Dainow & Jacobs

[57] ABSTRACT

A vertical, isolated-collector transistor of the pnp type comprises an island doped similarly to the collector region and formed in the surface epitaxial layer of the transistor between that collector region and one of the isolation zones. That island extends in depth to penetrate a similarly doped intermediate region and short out the epitaxial layer included between the isolating layer and the collector region so as to suppress the effects of active parasitic junction components by holding a transistor and a silicon-controlled rectifier of parasitic types, as nesting within the structure of the vertical pnp transistor, in a cut-off state.

4 Claims, 1 Drawing Sheet

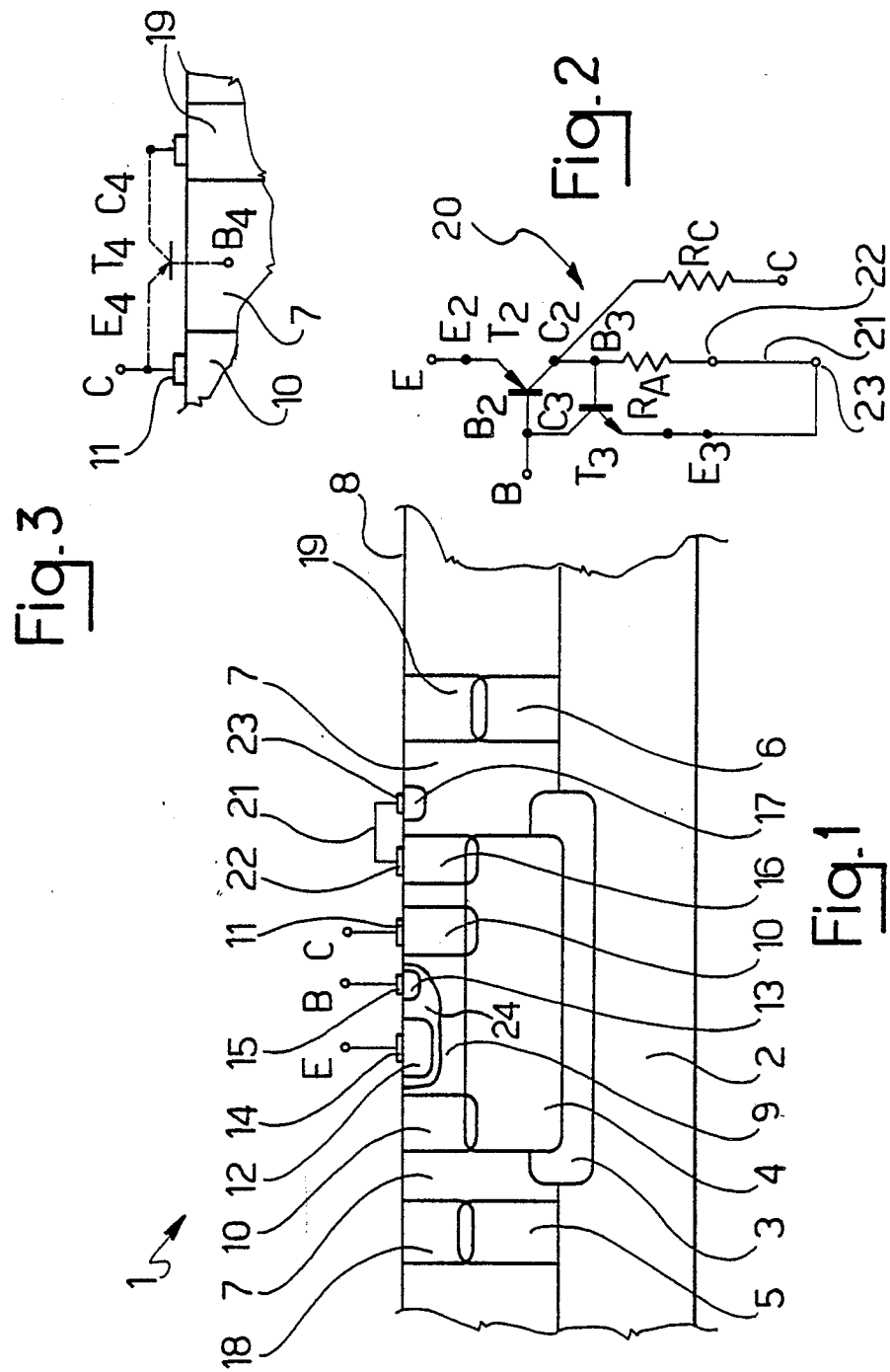

VERTICAL ISOLATED-COLLECTOR TRANSISTOR OF THE PNP TYPE INCORPORATING A DEVICE FOR SUPPRESSING THE EFFECTS OF PARASITIC JUNCTION COMPONENTS

DESCRIPTION

This invention relates to a vertical isolated-collector transistor of the pnp type incorporating a device for suppressing the effects of parasitic junction components.

BACKGROUND OF THE INVENTION

Such transistors are of the type which comprises a substrate of a semiconductor material having a low concentration of a dopant of a first type, a first layer, or bottom well layer, extending over the substrate and having a low concentration of a dopant of a second type, an intermediate region overlying said first, bottom well layer and being higher in concentration of the first-type dopant, and an epitaxial layer doped with the second-type dopant and covering the substrate and said region to define a transistor surface. Respective emitter, base, and collector regions of said transistor which are separated structurally are formed in said epitaxial layer, and opposedly located isolation zones are provided whose depth extends to the substrate and which are effective to border said regions laterally in the epitaxial layer, the collector region extending in depth to penetrate said intermediate region.

As is well known, vertical isolated-collector pnp transistors are widely employed in a very large number of circuit arrangements specifically intended for operation on a relatively high supply voltage.

However, the performance of such transistors and their characteristically good frequency response are affected by the presence, within their physical structure, of active parasitic junction components such as transistors or silicon-controlled rectifiers (SCR's).

In relation to the structure of the vertical isolated-collector pnp transistor referred to above, it may be appreciated that a parasitic component exists therein which consists of a transistor of the pnp type having its base open into the epitaxial layer, its emitter formed by the collector region of the vertical pnp, and its collector formed in an isolation zone.

The effect of that component could be one of delivering undesirable leakage currents to the substrate.

A first prior approach directed to obviating the presence of that parasitic transistor has been that of shorting out its base-emitter junction by biasing the epitaxial layer to the same potential as the collector of the vertical pnp transistor.

To this aim, there has been formed between the collector region and one of the isolation zones a small island doped with the same dopant type as the epitaxial layer, but having a higher dopant concentration. That island is effective to create an area of contact with the epitaxial layer to permit interconnection of that epitaxial layer and the collector terminating pin, externally of the transistor.

However, there is present in the vertical isolated-collector pnp transistor a second parasitic semiconductor device of the pnpn type comprising four superimposed emitter layers, a top well epitaxial layer, intermediate region, and bottom well layer. That device is a silicon-controlled rectifier of a parasitic type whose effect may well be that of degrading the transistor characteristics.

It is in the very attempt at suppressing the effect of the first parasitic transistor by shorting out the base-emitter junction in accordance with the prior technique that said silicon-controlled rectifier is turned on where the product of the collector current by the internal resistance of the collector region of the vertical pnp transistor equals the voltage drop between the base and the emitter of the parasitic transistor.

Furthermore, since the value of that resistance is quite a varying one even between spots on the semiconductor, the problem is encountered that the value of the collector current which triggers on the parasitic rectifier is undetermined.

SUMMARY OF THE INVENTION

The technical problem that underlies this invention is to provide a vertical isolated-collector pnp transistor which has such structural and performance characteristics as to minimize the effects of parasitic components nesting therein and being apt to result in the aforementioned trouble.

This problem is solved by a transistor as indicated being characterized in that said device comprises an island doped similarly to the collector region formed in the epitaxial layer between said collector region and an isolation zone and extending in depth to penetrate said intermediate region.

SUMMARY OF DRAWINGS

The features and advantages of a transistor according to the invention will be more clearly understood from the following detailed description of an embodiment thereof, to be taken by way of illustration and not of limitation in conjunction with the accompanying drawing.

In the drawing:

FIG. 1 is a vertical section showing schematically the physical structure of a transistor according to the invention;

FIG. 2 is a view showing schematically an equivalent circuit for the transistor of FIG. 1 and the active parasitic components incorporated to the latter; and FIG. 3 shows a further parasitic component incorporated to the transistor of FIG. 1.

DETAILED DESCRIPTION OF PREFERRED EMBODIMENTS

With reference to the drawing views, the numeral 1 generally and schematically designates a vertical isolated-collector pnp transistor according to this invention.

The transistor 1 comprises a substrate 2 of a semiconductor material having a given concentration of a dopant of a first type, in particular of the p type. Formed over the substrate 2 as by ion implantation is a buried bottom well layer 3 which has a given concentration of a second dopant type, in particular n type.

By implanting impurities of the p type, an intermediate region 4 is formed atop the buried layer 3 which is doped similarly to the substrate but with a higher concentration of dopant, identified as p+. In addition, the n-well buried layer 3 partly covers the substrate 2, and at opposite side ends of that layer 3, there are formed respective isolation zones 5 and 6 having the same dopant type as the intermediate region 4. These zones 5 and 6 are formed by implantation concurrently with the region 4 and using the same mask.

An epitaxial layer 7 having a low concentration of n-type dopant is grown on top of the substrate 2 as well as of the region 4 and layer 3.

The epitaxial layer 7 extends in height enough to define a surface 8 for the transistor 1. Also formed by diffusion in the epitaxial layer 7 is an annular island with dopant of the p+type which extends in depth to penetrate the intermediate region 4. That island 10 is to provide the collector region for the transistor 1. Over the region 10 is a metallic contact layer 11 for connection to an external collector terminal C of the transistor 1.

Enclosed within the island 10, over the region 4, is a portion 9 of the epitaxial layer wherein a top-n-well region 24 is formed following selective enrichment. Within the top-n-well region 24 there are respectively formed, as by ion implantation, an emitter region 12 with dopant of the p type, and a base region 13 with dopant of the n+type; said regions 12 and 13 are both covered at the top by respective electrodes for connection to external emitter and base terminals, E and B, of the transistor 1.

Also provided are further peripheral isolation zones 18 and 19 with dopant of the p+type, which are formed in the layer 7 on top of the aforementioned isolation zones 5 and 6 and extends in depth to penetrate the latter so that the transistor 1 will be isolated from other electronic devices formed on the same semiconductor substrate 2.

Advantageously according to the invention, laterally of the collector region 10, between that region and the peripheral isolation zone 19, there is formed in the epitaxial layer 7 a further island 16 with dopant of the p+type. That island 16 extends in depth to penetrate the underlying intermediate region 4.

Also provided is a contact island 17 with dopant of the n+type which is formed laterally of the aforesaid island 16 in the epitaxial layer 7.

Located above the islands 16 and 17 are respective electrodes 22 and 23 which are interconnected electrically by a connection 21 made of a conductive material.

The island 16 functions to short out the epitaxial layer 7 included between the isolation zone 19 and the collector region 10 to the region 4.

With specific reference to the embodiment shown in FIG. 2, the structure of a silicon-controlled rectifier (SCR) 20 of a parasitic type present within the structure of the transistor 1 will be now described.

The rectifier 20 is illustrated diagramatically by FIG. 2 as an equivalent circuit comprising the transistor 1 corresponding to the transistor T2 of the pnp type having its emitter E2 connected to the emitter terminal E and its base B2 connected to the terminal B.

That transistor T2 is also connected to another transistor T3 of the npn type which has its base B3 connected to the collector C2 of said transistor T2 and its collector C3 connected to the base B2, while having the emitter E3 and base B3 interconnected via a resistor RA.

The emitter-base junction E2-B2 of the transistor T2 corresponds to the pn junction between the emitter region 12 of the transistor 1 and the epitaxial layer 7, whilst the base-collector junction B2-C2 corresponds to the np junction between that epitaxial layer 7 and the intermediate region 4.

Likewise, the base-collector junction C3-B3 of the transistor T3 corresponds to the np junction between the epitaxial layer 7 and the intermediate region 4, whilst the base-emitter junction B3-E3 corresponds to the pn junction between that region 4 and the n-well buried layer 3.

In addition, a resistor RC is connected between the collector terminal C and the base B3 of the transistor T3. This resistance corresponds to the internal resistance of the collector region 10 of the transistor 1.

The above-mentioned resistance RA represents instead the internal resistance of the island 16, doped p+, which associates with the collector region 10. One end of the resistor RA is connected directly to the base B3 since the island 16 penetrates the intermediate region 4 of like doping in which that base B3 is formed. The other end of the resistor RA is connected to the emitter E3 via the electrodes 22, 23 and the direct connection 21 therebetween, as well as by virtue of the electrical continuity established from the island 17, through the epitaxial layer 7, to the buried layer 3 wherein the emitter E3 is formed.

With reference to the embodiment shown in FIG. 3, a transistor T4 of the pnp type appears therein which is in turn incorporated to the transistor 1 and constitutes a parasitic component. That transistor T4 has its emitter E4-to-base B4 junction formed by the pn junction between the collector region 10 and the epitaxial layer 7, whilst the base B4-to-collector C4 junction is formed by the np junction between the epitaxial layer 7 and the isolation zone 19. The base B4 of the transistor opens into the epitaxial layer 7.

It may be appreciated from the foregoing discussion that the p+island 16 of this invention is a structurally independent one, but connected to the collector region 10 inasmuch as they both penetrate the intermediate region 4 of like doping.

Through the contact with that island 16 and the further connection of the latter to the epitaxial layer via the connection 21, the collector region 10 becomes in turn connected to the epitaxial layer 7.

That portion of the epitaxial layer 7 which is included between the isolation zone 19 and the collector C of the transistor 1 is shorted out, which results in the parasitic transistor T4 being cut off by suppression of the drop of potential between the base B4 and the emitter E4.

In addition, the region 16 provides a so-called Kelvin contact, and accordingly, the flow of transistor 1 collector current will be cut off. In other words, that contact island 16 allows of the imposition of a predetermined potential value while impeding the collector current flow.

Thus, and especially with high voltage supplies, the added effect is achieved of preventing the rectifier 20 formed by the transistors T2 and T3 from being triggered on, by virtue of the resistor RA being provided inherently to the Kelvin contact 16 between the base and the emitter of the transistor T3. This affords, moreover, as a first advantage that the size of the transistor 1 is left substantially unaltered, inasmuch as only the collector region 10 requires to be sized to suit the level of the collector current flowing therethrough, whilst the Kelvin contact size can be minimized while having an inherent resistance which may be quite high.

Another advantage resides in that the transistor of this invention involves no additional costs for its manufacture because the p+island would be formed during the final stages of masking and diffusion in the production cycle.

The performance of the vertical isolated-collector pnp transistor according to the invention is greatly enhanced, and the evident simplicity of its implementation fully meets the demands for versatility and high performance from this transistor type.

We claim:

1. A vertical isolated-collector transistor of the pnp type incorporating a device for suppressing the effects of parasitic junction components, said transistor comprising a substrate of a semiconductor material having a low concentration of a dopant of a first type, a first layer or bottom well layer extending over the substrate and having a low concentration of a dopant of a second type, a buried intermediate region overlying said first bottom well layer and being higher in concentration of the first-type dopant, an epitaxial layer doped with the second-type dopant and covering the substrate and said region to define a transistor surface, respective emitter, base, and collector regions of said transistor which are separated structurally and formed in said epitaxial layer, and oppositely located isolation zones whose depth extends to the substrate and which are effective to border said regions laterally in the epitaxial layer, the collector region extending in depth to penetrate said intermediate region, characterized in that said device comprises an island region doped of first-type dopant similarly to the collector region and laterally distinct and separate from the collector region and formed in the epitaxial layer between said collector region and an isolation zone and extending in dept to penetrate said intermediate region.

2. A transistor according to claim 1, characterized in that said island extends laterally between only one side of said collector region and an adjacent side of said isolation zone, and further comprising means for electrically connecting said island region to said epitaxial layer.

3. A transistor according to claims 1 or 2, characterized in that said island region is provided with a metallic contact, and that in said epitaxial layer there is formed a second contact island that has a higher concentration of second-type dopant, said second island being in turn provided with a contact, said contacts being interconnected electrically by a conductor.

4. A transistor as claimed in claim 1, further comprising separate surface contacts to the emitter, base, collector, and island regions and to the epitaxial layer.

* * * * *